United States Patent
Kodama et al.

(10) Patent No.: US 9,212,298 B2
(45) Date of Patent: Dec. 15, 2015

(54) ADHESIVE SHEET AND METHOD FOR MANUFACTURING SEMICONDUCTOR DEVICE

(71) Applicant: HITACHI CHEMICAL COMPANY, LTD., Chiyoda-ku, Tokyo (JP)

(72) Inventors: Megumi Kodama, Ichihara (JP); Takahiro Tokuyasu, Ichihara (JP); Tetsurou Iwakura, Chikusei (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/383,227

(22) PCT Filed: Mar. 5, 2013

(86) PCT No.: PCT/JP2013/056002
§ 371 (c)(1),
(2) Date: Sep. 5, 2014

(87) PCT Pub. No.: WO2013/133275
PCT Pub. Date: Sep. 12, 2013

(65) Prior Publication Data
US 2015/0050780 A1 Feb. 19, 2015

(30) Foreign Application Priority Data

Mar. 8, 2012 (JP) ................................. 2012-052156
Dec. 28, 2012 (JP) ................................. 2012-288113

(51) Int. Cl.
*C08F 8/00* (2006.01)
*C08L 61/04* (2006.01)
(Continued)

(52) U.S. Cl.
CPC . *C09J 7/00* (2013.01); *H01L 24/27* (2013.01); *H01L 24/29* (2013.01); *H01L 24/48* (2013.01);
(Continued)

(58) Field of Classification Search
CPC ...................................................... C09J 163/00
USPC .................. 525/109, 481, 523; 438/118, 464
See application file for complete search history.

(56) References Cited

U.S. PATENT DOCUMENTS 5,366,933 A * 11/1994 Golwalkar et al. ............. 29/827
2001/0016616 A1 * 8/2001 Yeager et al. .................. 524/101
(Continued)

FOREIGN PATENT DOCUMENTS

JP 2001-279197 A 10/2001
JP 2002-72009 A 3/2002
(Continued)

OTHER PUBLICATIONS

Notification of Transmittal of Translation of the International Preliminary Report on Patentability (Chapter I or Chapter II) dated Sep. 18, 2014, for International (PCT) Application No. PCT/JP2013/056002, filed Mar. 5, 2013.

*Primary Examiner* — Mary Wilczewski
*Assistant Examiner* — Erik T Peterson
(74) *Attorney, Agent, or Firm* — Fitch, Even, Tabin & Flannery LLP (57) ABSTRACT

The adhesive sheet of the invention comprises a resin composition containing (A) a high-molecular-weight component, (B1) a thermosetting component having a softening point of below 50° C., (B2) a thermosetting component having a softening point of between 50° C. and 100° C. and (C) a phenol resin having a softening point of no higher than 100° C., the composition containing 11 to 22 mass % of the (A) high-molecular-weight component, 10 to 20 mass % of the (B1) thermosetting component having a softening point of below 50° C., 10 to 20 mass % of the (B2) thermosetting component having a softening point of between 50° C. and 100° C. and 15 to 30 mass % of the phenol resin having a softening point of no higher than 100° C., based on 100 mass % of the resin composition.

9 Claims, 7 Drawing Sheets (51) Int. Cl.
*C08L 63/00* (2006.01)
*C08L 69/00* (2006.01)
*H01L 21/00* (2006.01)
*C09J 7/00* (2006.01)
*H01L 23/00* (2006.01)
*C09J 113/00* (2006.01)

(52) U.S. Cl.
CPC .............. *H01L 24/49* (2013.01); *H01L 24/83* (2013.01); *C09J 113/00* (2013.01); *C09J 2201/61* (2013.01); *C09J 2203/326* (2013.01); *C09J 2413/00* (2013.01); *C09J 2461/00* (2013.01); *C09J 2463/00* (2013.01); *H01L 24/45* (2013.01); *H01L 24/85* (2013.01); *H01L 2221/68327* (2013.01); *H01L 2221/68377* (2013.01); *H01L 2224/27001* (2013.01); *H01L 2224/2929* (2013.01); *H01L 2224/29386* (2013.01); *H01L 2224/32145* (2013.01); *H01L 2224/32225* (2013.01); *H01L 2224/45144* (2013.01); *H01L 2224/48* (2013.01); *H01L 2224/48091* (2013.01); *H01L 2224/48096* (2013.01); *H01L 2224/48106* (2013.01); *H01L 2224/48227* (2013.01); *H01L 2224/48472* (2013.01); *H01L 2224/49179* (2013.01); *H01L 2224/73265* (2013.01); *H01L 2224/83191* (2013.01); *H01L 2224/83203* (2013.01); *H01L 2224/83855* (2013.01); *H01L 2224/83862* (2013.01); *H01L 2224/92247* (2013.01); *H01L 2924/14* (2013.01); *H01L 2924/15311* (2013.01); *H01L 2924/20104* (2013.01); *H01L 2924/20105* (2013.01); *H01L 2924/20106* (2013.01)

(56) References Cited

U.S. PATENT DOCUMENTS

| | | | |
|---|---|---|---|
| 2002/0049264 A1* | 4/2002 | Maekawa et al. | 523/466 |
| 2003/0069331 A1* | 4/2003 | Teiichi et al. | 523/176 |
| 2003/0159773 A1* | 8/2003 | Tomiyama et al. | 156/248 |
| 2008/0241995 A1* | 10/2008 | Fukui et al. | 438/109 |
| 2010/0219507 A1* | 9/2010 | Misumi et al. | 257/618 |

FOREIGN PATENT DOCUMENTS

| | | |
|---|---|---|
| JP | 2002-220576 A | 8/2002 |
| JP | 2002-222913 A | 8/2002 |
| JP | 3913481 B2 | 5/2007 |
| JP | 2008-74928 A | 4/2008 |
| JP | 2008-274259 | * 11/2008 |
| JP | 2008-274259 A | 11/2008 |
| JP | 2011-18806 A | 1/2011 |
| KR | 10-2008-0080421 A | 9/2008 |

* cited by examiner

ADHESIVE SHEET AND METHOD FOR MANUFACTURING SEMICONDUCTOR DEVICE

TECHNICAL FIELD

The present invention relates to an adhesive sheet and to a method for manufacturing a semiconductor device comprising an adhesive layer-attached semiconductor chip using the adhesive sheet.

BACKGROUND ART

Recent years have seen increasing use of stacked MCPs (Multi Chip Packages) having stacks of memory package chips, for cellular phones, portable audio devices and the like. The increasing multifunctionality of image processing technologies and cellular phones has also spurred advances toward higher integration, higher densification and smaller thicknesses of such packages. The films used to produce such semiconductor devices include the adhesive sheets described in Patent Literatures 1 to 5, for example.

CITATION LIST

Patent Literature

[Patent Literature 1] Japanese Unexamined Patent Application Publication No. 2001-279197
[Patent Literature 2] Japanese Unexamined Patent Application Publication No. 2002-222913
[Patent Literature 3] Japanese Patent Publication No. 3913481
[Patent Literature 4] Japanese Unexamined Patent Application Publication No. 2002-220576
[Patent Literature 5] Japanese Unexamined Patent Application Publication No. 2004-072009

SUMMARY OF INVENTION

Technical Problem

As progress continues in thin-film formation of semiconductor wafers and micronization of wirings in recent years, there is increasing demand for development of adhesive films that allow semiconductor devices with high reliability to be obtained. In particular, there is demand for low tack to increase workability during the pickup steps, and low viscosity to ensure embeddability of adhesives onto the concavoconvex sections of the board or semiconductor chip or onto wires, during the die attach step.

Incidentally, when a low viscosity adhesive film is used in fabrication of a semiconductor device, it is essential to perform an after-cure step in which heat is applied to the adhesive in order to minimize foaming during wire bonding. A semiconductor device employing a low viscosity adhesive film can generally be produced by the following method. An adhesive sheet is attached to the semiconductor wafer first, and it is then diced for individuation of the semiconductor wafer. Next, the obtained semiconductor chips are released from the adhesive sheet (pickup step) and contact bonded with a board or the like via an adhesive (die attach step). The aforementioned after-curing (film curing step) is then carried out, after which the semiconductor chips are connected to the board by wire bonding. A step of further layering semiconductor chips while bonding via an adhesive and connecting the semiconductor chips to the board by wire bonding is further repeated as necessary. Semiconductor chips are successively layered in this manner. Upon completion of all of the steps of connection by wire bonding, the semiconductor chips are sealed with a resin.

However, with the adhesive films described in Patent Literatures 1 to 5 it is difficult to adequately embed the adhesive into the board or the semiconductor chips or wires simply by contact bonded mounting with a low temperature and low load in the die attach step. Furthermore, because the film has low viscosity, the cohesive force of the film is strong with high tack, and this can result in a problem of inability to accomplish pickup in the pickup step, or a problem of requiring repetition of the film curing step to minimize foaming, which severely lengthens the processing time.

The present invention has been accomplished with the aim of solving these problems, and its object is to provide an adhesive sheet that has increased production efficiency as well as satisfactory embeddability and pickup properties, and that allows semiconductor devices with high reliability to be obtained.

Solution to Problem

In order to solve the aforementioned problems, an adhesive sheet according to one aspect of the invention comprises a resin composition containing (A) a high-molecular-weight component, (B1) a thermosetting component having a softening point of below 50° C., (B2) a thermosetting component having a softening point of between 50° C. and 100° C. and (C) a phenol resin having a softening point of no higher than 100° C., the composition containing 11 to 22 mass % of the (A) high-molecular-weight component, 10 to 20 mass % of the (B1) thermosetting component having a softening point of below 50° C., 10 to 20 mass % of the (B2) thermosetting component having a softening point of between 50° C. and 100° C. and 15 to 30 mass % of the phenol resin having a softening point of no higher than 100° C., based on 100 mass % of the resin composition.

By specifying components (A), (B1), (B2) and (C) and their contents in the adhesive composition, an adhesive sheet according to one aspect of the invention can contain its components in a compatible manner and exhibit tack strength and reduced melt viscosity at 80° C. It is thus possible to impart satisfactory pickup properties and die bonding properties, and to increase the reliability of the obtained semiconductor devices. In addition, using the adhesive sheet to produce a semiconductor device can minimize foaming during wire bonding even when the after-cure time has been shortened. Consequently, with an adhesive sheet according to one aspect of the invention it is possible to increase production efficiency while providing a semiconductor device with high reliability.

Also, in the adhesive sheet according to one aspect of the invention, the adhesive layer may have a melt viscosity of 300 to 3000 Pa·s at 80° C. This will allow the adhesive to adequately and satisfactorily fill the recesses of concavoconvexities formed on the surfaces of boards and the like in the die bonding step. It will therefore be possible to increase the adhesion between boards and semiconductor chips, and to further increase the reliability of semiconductor devices.

The method for manufacturing a semiconductor device according to one aspect of the invention is a method for manufacturing a semiconductor device comprising an adhesive layer-attached semiconductor chip using the adhesive sheet described above, and it includes a film curing step in which the adhesive layer-attached semiconductor chip is contact bonded onto a circuit board and the adhesive layer is then heated at 110° C. to 125° C. for 0.5 to 1 hour, and a wire bonding step in which the adhesive layer-attached semiconductor chip and the circuit board are electrically connected via bonding wire at no higher than 230° C.

According to this manufacturing method, the after-cure time is shorter than when using a conventional adhesive sheet, and semiconductor device production efficiency is increased.

Advantageous Effects of Invention

According to the invention it is possible to provide an adhesive sheet that has increased production efficiency as well as satisfactory embeddability and pickup properties, and that allows semiconductor devices with high reliability to be obtained.

DESCRIPTION OF EMBODIMENTS

Embodiments of the invention will now be explained in detail, with reference to the accompanying drawings. Throughout the explanation which follows, identical or corresponding parts will be referred to by like reference numerals and will be explained only once. Unless otherwise specified, the vertical and horizontal positional relationships are based on the positional relationships in the drawings. Also, the dimensional proportions depicted in the drawings are not necessarily limitative.

<Adhesive Sheet>

Figure 1:
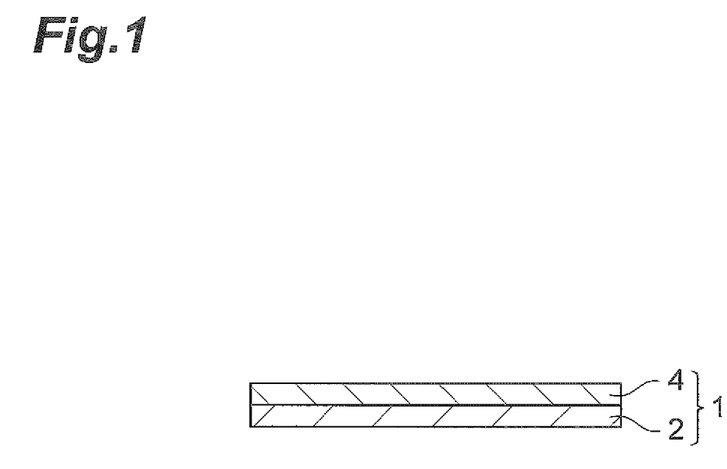
FIG. 1 is a simplified cross-sectional view of an adhesive sheet according to a first embodiment.

FIG. 1 is a simplified cross-sectional view of an adhesive sheet according to a first embodiment. As shown in FIG. 1, the adhesive sheet 1 has a construction with an adhesive layer 4 laminated on a base material 2. It is assumed that the adhesive sheet 1 is attached to the back side of the circuit side of the semiconductor wafer in the laminating step during production of the semiconductor device, as described below.

The melt viscosity of the adhesive layer 4 at 80° C. is 300 to 3000 Pa·s, preferably 500 to 2900 Pa·s, more preferably 1000 to 2800 Pa·s, even more preferably 1000 to 2000 Pa·s and most preferably 1000 to 1500 Pa·s. The melt viscosity can be measured using a rotating viscoelasticity meter, for example.

The tack strength of the adhesive layer 4 is preferably 0 to 1000 gf and more preferably 0 to 500 gf, at 30° C. The tack strength is the value measured by the probe method. Specifically, the adhesive layer of the adhesive sheet is fixed onto a parallel glass plate with double-sided tape, and the base film is peeled off from the adhesive sheet. Also, a probe is placed on a 30° C. hot plate and pressed against the surface of the adhesive layer under the following conditions, and the measured strength upon pulling the probe from the adhesive layer is recorded. The tack strength is measured under conditions with a test speed of 5 mm/min, an initial load (preload) of 100 gf/cm$^2$ and a press time of 1.0 seconds.

If the tack strength of the adhesive layer 4 exceeds 500 gf, the cohesive property of the surface of the obtained adhesive layer at room temperature will be high, tending to impair its handleability.

The thickness of the adhesive layer 4 is preferably 5 to 150 μm and more preferably 20 to 60 μm. If the thickness is less than 5 μm the stress relaxation effect or adhesion will tend to be low, while a thickness exceeding 150 μm is not economical.

The adhesive layer 4 comprises a resin composition containing (A) a high-molecular-weight component, (B1) a thermosetting component having a softening point of below 50° C., (B2) a thermosetting component having a softening point of between 50° C. and 100° C. and (C) a phenol resin having a softening point of no higher than 100° C. Specific examples of the components in the resin composition and the contents of each of the components will now be described.

(A) High-molecular-weight Component

The (A) high-molecular-weight component (hereunder referred to simply as "component (A)") has a crosslinkable functional group, and examples include polyimide resins, (meth)acrylic copolymers, urethane resins, polyphenylene ether resins, polyetherimide resins, phenoxy resins and modified polyphenylene ether resins having crosslinkable functional groups, among which (meth)acrylic copolymers with crosslinkable functional groups are preferred. These components (A) may be used alone or in combinations of two or more. The crosslinkable functional group may be present in the polymer chain, or at the ends of the polymer chain. Specific examples of crosslinkable functional groups include epoxy, alcoholic hydroxyl, phenolic hydroxyl and carboxyl groups, among which epoxy groups are preferred, and these may be introduced into the polymer chain using an epoxy group-containing monomer such as glycidyl(meth)acrylate.

Component (A) is preferably an epoxy group-containing (meth)acrylic copolymer, examples of which include epoxy group-containing (meth)acrylic acid ester copolymers and epoxy group-containing acrylic rubbers, with epoxy group-containing (meth)acrylic acid ester copolymers being more preferred. Acrylic rubber is composed mainly of acrylic acid ester, and examples include rubbers comprising copolymers of butyl acrylate or ethyl acrylate with acrylonitrile. The polymerization method is not particularly restricted, and pearl polymerization, solution polymerization or the like may be employed.

The glass transition temperature of component (A) is preferably −50° C. to 50° C. and more preferably −30° C. to 20° C. If the glass transition temperature of the high-molecular-weight component is −50° C. or higher, the tack will be reduced after formation into a sheet film, thereby improving the handleability. Also, if the glass transition temperature of the high-molecular-weight component is no higher than 50° C. it will be possible to ensure a flow property.

The weight-average molecular weight of component (A) (hereunder referred to as "Mw") is not particularly restricted but is preferably 50,000 to 1,200,000, more preferably 100,000 to 1,200,000 and even more preferably 300,000 to 900,000. If the Mw of component (A) is 50,000 or greater the film formability will be satisfactory, and if the Mw of component (A) is no greater than 1,200,000 the flow property will be increased. The Mw value is the value measured by gel permeation chromatography (GPC) and calculated using a calibration curve based on standard polystyrene, and measurement may be performed using L-6000 (product name of Hitachi, Ltd.) as the pump, a column having Gelpack GL-R440 (product name of Hitachi Chemical Co., Ltd.), Gelpack GL-R450 and Gelpack GL-R400M (each being 10.7 mm (diameter)×300 mm) connected in that order as the column, and tetrahydrofuran (hereunder, "THF") as the eluent, at a flow rate of 1.75 mL/min for 120 mg of sample dissolved in 5 ml of THF.

The content of component (A) is 11 to 22 mass % based on 100 mass % of the resin composition. Also, the content of component (A) is preferably 13 to 20 mass %, more preferably 15 to 18 mass % and even more preferably 15 to 17 mass %, based on 100 mass % of the resin composition.

(B) Thermosetting Component

The (B) thermosetting component used is preferably an epoxy resin that reacts at 150° C. or higher for high molecularization, as a mixture of (B1) a thermosetting component having a softening point of below 50° C. (hereunder referred to simply as "component (B1)") and (B2) a thermosetting component having a softening point of between 50° C. and 100° C. (hereunder referred to simply as "component (B2)").

The epoxy resin is not particularly restricted so long as it has a bonding effect when cured. There may be used a bifunctional epoxy resin such as bisphenol A-type epoxy resin, bisphenol F-type epoxy resin or bisphenol S-type epoxy resin, or a novolac-type epoxy resin such as phenol-novolac-type epoxy resin or cresol-novolac-type epoxy resin. Any generally known resins may also be used, such as polyfunctional epoxy resins, glycidylamine-type epoxy resins, heterocyclic ring-containing epoxy resins or alicyclic epoxy resins.

As component (B1) it is preferred to use a novolac-type epoxy resin, for example. As component (B2) it is preferred to use a bisphenol F-type epoxy resin, for example.

The content of component (B1) is 10 to 20 mass % based on 100 mass % of the resin composition.

The content of component (B2) is 10 to 20 mass % based on 100 mass % of the resin composition.

(C) Phenol Resin Having a Softening Point of no Higher than 100° C.

The (C) phenol resin having a softening point of no higher than 100° C. (hereunder referred to simply as "component (C)") functions as a curing agent. By limiting the softening point to no higher than 100° C., it is possible to lower the melt viscosity of the adhesive composition and improve the embeddability into concavoconvex sections of boards and semiconductor chips, and into wires. The softening point is preferably 50° C. to 100° C. If the softening point of the phenol resin used is lower than 50° C., the workability at room temperature will tend to be reduced. Also, preferably component (C) is a phenol resin having a water absorption percentage of no greater than 2 mass % after being introduced for 48 hours in a thermo-hygrostat at 85° C., 85% RH, and a heating weight loss (temperature-elevating rate: 5° C./min, atmosphere: nitrogen) of less than 5 mass % at 350° C. as measured with a thermogravimetric analyzer (TGA).

For this embodiment, phenol resins that are suitable for use as the curing agent may be available commercial products. Examples include the "MILEX XLC-Series" and "MILEX XL-Series", trade names of Mitsui Chemicals, Inc., and "PHENOLITE LF-4871", trade name of Dainippon Ink and Chemicals, Inc. Preferred among these is "MILEX XLC-LL" (softening point: 70° C.) which has a lower softening point, since it allows the crosslink density during curing to be controlled to a lower level. According to the invention, a phenol resin as an epoxy resin curing agent is also included in the curing agent.

The content of component (C) is 15 to 30 mass % based on 100 mass % of the resin composition.

(D) Filler

There are no particular restrictions on the (D) filler, but it is preferably an inorganic filler, and for example, aluminum hydroxide, magnesium hydroxide, calcium carbonate, magnesium carbonate, calcium silicate, magnesium silicate, calcium oxide, magnesium oxide, alumina, aluminum nitride, aluminum borate whiskers, boron nitride, crystalline silica or amorphous silica may be used. These may be used alone or in combinations of two or more, but their addition is not necessary if there is no particular problem. The content of the (D) filler is preferably 0 to 0.15 mass % based on 100 mass % of the resin composition.

From the viewpoint of improving thermal conductivity, it is preferred to use alumina, aluminum nitride, boron nitride, crystalline silica or amorphous silica. Also, from the viewpoint of adjusting the melt viscosity and imparting a thixotropic property, it is preferred to use aluminum hydroxide, magnesium hydroxide, calcium carbonate, magnesium carbonate, calcium silicate, magnesium silicate, calcium oxide, magnesium oxide, alumina, crystalline silica or amorphous silica. From the viewpoint of improving the dicing property, it is preferred to use alumina or silica.

The mean particle diameter of the (D) filler is preferably 0.005 to 2.0 μm. If the mean particle diameter is less than 0.005 μm or greater than 2.0 μm, the adhesion property of the adhesive sheet may potentially be lowered. In order to obtain satisfactory film formability and high adhesive force, the mean particle diameter of the (D) filler is more preferably 0.005 to 1.5 μm and even more preferably 0.005 to 1.0 μm.

Furthermore, the adhesive sheet 1 of this embodiment additionally contains (E) a curing accelerator or (F) a coupling agent, for more excellent adhesion and connection reliability.

(E) Curing Accelerator

The (E) curing accelerator is not particularly restricted, and examples include cycloamidine compounds such as 1,8-diazabicyclo[5.4.0]undecene-7, 1,5-diazabicyclo[4.3.0]nonene-5 and 5,6-dibutylamino-1,8-diazabicyclo[5.4.0]undecene-7, as well as compounds having intramolecular polarization by addition to these compounds of compounds with π-bonds such as maleic anhydride, quinone compounds such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone and phenyl-1,4-benzoquinone, diazophenylmethane, phenol resins and the like, tertiary amines such as benzyldimethylamine, triethanolamine, dimethylaminoethanol and tris(dimethylaminomethyl)phenol and their derivatives, imidazoles such as 1-cyanoethyl-2-phenylimidazole, 2-methylimidazole, 2-phenylimidazole, 2-phenyl-4-methylimidazole and 2-heptadecylimidazole and their derivatives, organic phosphines such as tributylphosphine, methyldiphenylphosphine, triphenylphosphine, tris(4-methylphenyl)phosphine, diphenylphosphine and phenylphosphine, and phosphorus compounds having intramolecular polarization by addition to these phosphines of compounds with π-bonds such as maleic anhydride or the aforementioned quinone compounds, diazophenylmethane or phenol resins, and tetraphenylboron salts including tetra-substituted phosphonium/tetra-substituted borates such as tetraphenylphosphonium tetraphenylborate, tetraphenylphosphonium ethyltriphenylborate and tetrabutylphosphonium tetrabutylborate, 2-ethyl-4-methylimidazole tetraphenyl borate and N-methylmorpholine tetraphenyl borate, and their derivatives. These curing accelerators may be used alone or in combinations of two or more. Among these, imidazoles are preferably included as curing accelerators. The content of the (E) curing accelerator is preferably 28 to 38 mass % based on 100 mass % of the resin composition.

(F) Coupling Agent

By including the (F) coupling agent, it is possible to increase interfacial bonding between different types of materials in the resin composition. Coupling agents include silane-based coupling agents, titanate-based coupling agents and aluminum-based coupling agents, with silane-based coupling agents being preferred among these.

Specific examples of silane-based coupling agents include vinyltrichlorosilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-glycidoxypropylmethyldimethoxysilane, vinyltriacetoxysilane, γ-mercaptopropyltrimethoxysilane, γ-aminopropyltrimethoxysilane, γ-aminopropylmethyldimethoxysilane, γ-aminopropyltriethoxysilane, γ-aminopropylmethyldiethoxysilane, γ-anilinopropyltrimethoxysilane, γ-anilinopropyltriethoxysilane, γ-(N,N-dimethyl)aminopropyltrimethoxysilane, γ-(N,N-diethyl)aminopropyltrimethoxysilane, γ-(N,N-dibutyl)aminopropyltrimethoxysilane, γ-(N-methyl)anilinopropyltrimethoxysilane, γ-(N-ethyl)anilinopropyltrimethoxysilane, γ-(N,N-dimethyl)aminopropyltriethoxysilane, γ-(N,N-diethyl)aminopropyltriethoxysilane, γ-(N,N-dibutyl)aminopropyltriethoxysilane, γ-(N-methyl)anilinopropyltriethoxysilane, γ-(N-ethyl)anilinopropyltriethoxysilane, γ-(N,N-dimethyl)aminopropylmethyldimethoxysilane, γ-(N,N-diethyl)aminopropylmethyldimethoxysilane, γ-(N,N-dibutyl)aminopropylmethyldimethoxysilane, γ-(N-methyl)anilinopropylmethyldimethoxysilane, γ-(N-ethyl)anilinopropylmethyldimethoxysilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, γ-chloropropyltrimethoxysilane, hexamethyldisilane, vinyltrimethoxysilane and γ-mercaptopropylmethyldimethoxysilane.

A method for manufacturing an adhesive sheet 1 according to this embodiment will now be described. First, a varnish comprising a resin composition is prepared. The varnish is prepared by mixing and kneading each of the components of the resin composition in an organic solvent. The mixing and kneading can generally be accomplished by an appropriate combination of dispersers such as a stirrer, kneader, triple roll or ball mill.

The organic solvent to be used for preparation of the varnish is not particularly restricted so long as it allows the components of the resin composition to be uniformly dissolved, kneaded and dispersed, and any publicly known one may be used. Examples of such solvents include amide-based solvents such as dimethylformamide, dimethylacetamide and N-methylpyrrolidone; ketone-based solvents such as acetone, methyl ethyl ketone and cyclohexanone; and hydrocarbon-based solvents such as toluene and xylene. Methyl ethyl ketone, cyclohexanone are preferably used from the viewpoint of fast drying speed and low cost.

The organic solvent is preferably used in a range such that the residual volatile content in the formed resin composition is 0 to 1.0 mass % based on the total mass, and for concerns regarding reduced reliability due to foaming of the adhesive layer 4, it is preferably used in a range for 0 to 0.8 mass % based on the total mass.

Next, each obtained varnish is uniformly coated onto a base film to form a varnish layer. There are no particular restrictions on the base film, and for example, a polyester film, polypropylene film, polyethylene terephthalate film, polyimide film, polyetherimide polyether naphthalate film or methylpentene film may be used. Such base films may be subjected to surface treatment such as primer coating, UV treatment, corona discharge treatment, polishing treatment or etching treatment, according to the need. The thickness of the base film is not particularly restricted, and may be appropriately selected depending on the thickness of the adhesive layer 4 and the purpose of use of the adhesive sheet 1.

Each varnish is coated and heat dried to obtain a sheet comprising a first adhesive layer 4a and a second adhesive layer 4b. After drying of the adhesive layer, the base film may be removed off to obtain each adhesive sheet composed only of the adhesive layer. The conditions for the heat drying are not particularly restricted so long as they are conditions under which the organic solvent used sufficiently volatilizes off, but for most purposes heating is conducted at 60° C. to 200° C. for 0.1 to 90 minutes. An adhesive sheet 1 can be produced through this series of steps.

<Method for Manufacturing Semiconductor Device>

Figure 2:
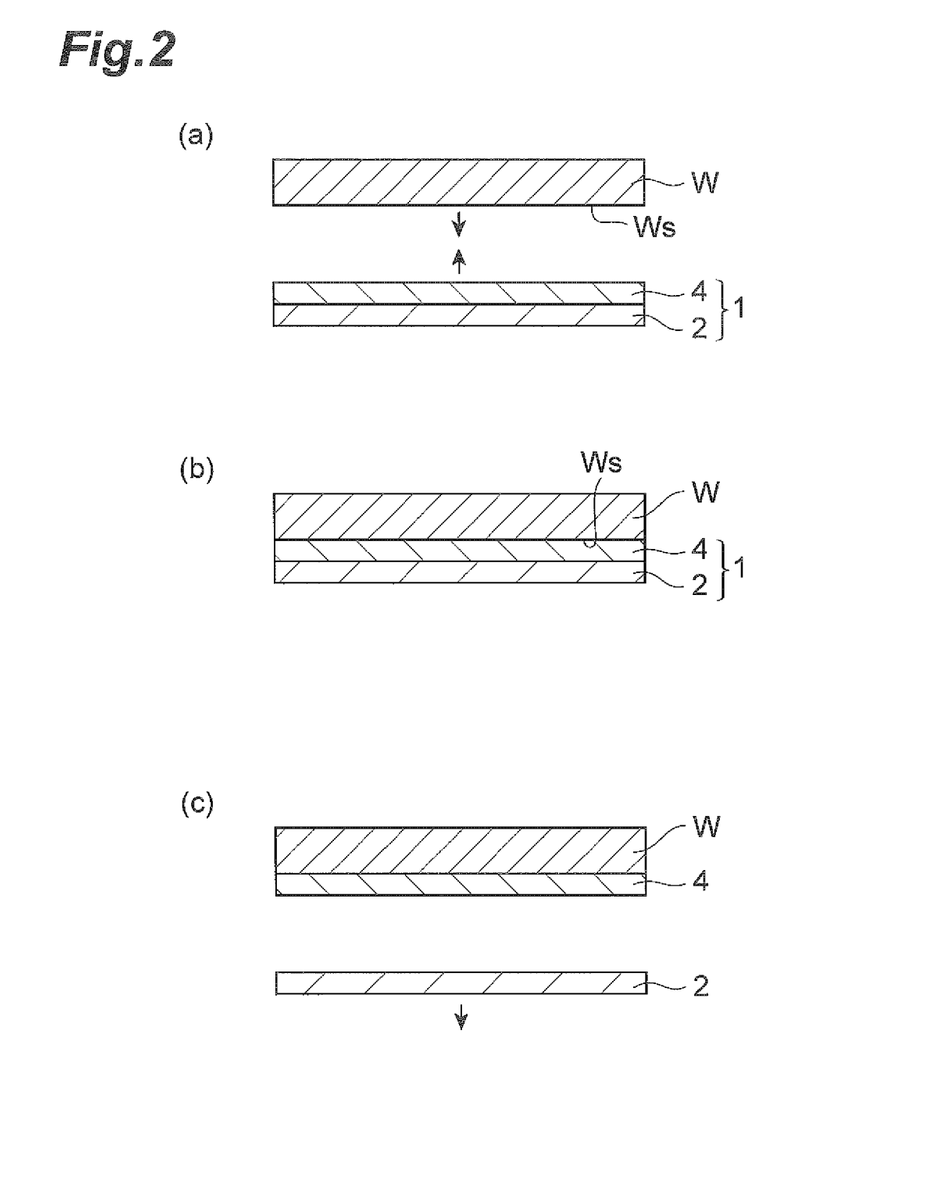
FIG. 2 is a cross-sectional diagram showing one step in the method for manufacturing a semiconductor device according to the first embodiment.
Figure 3:
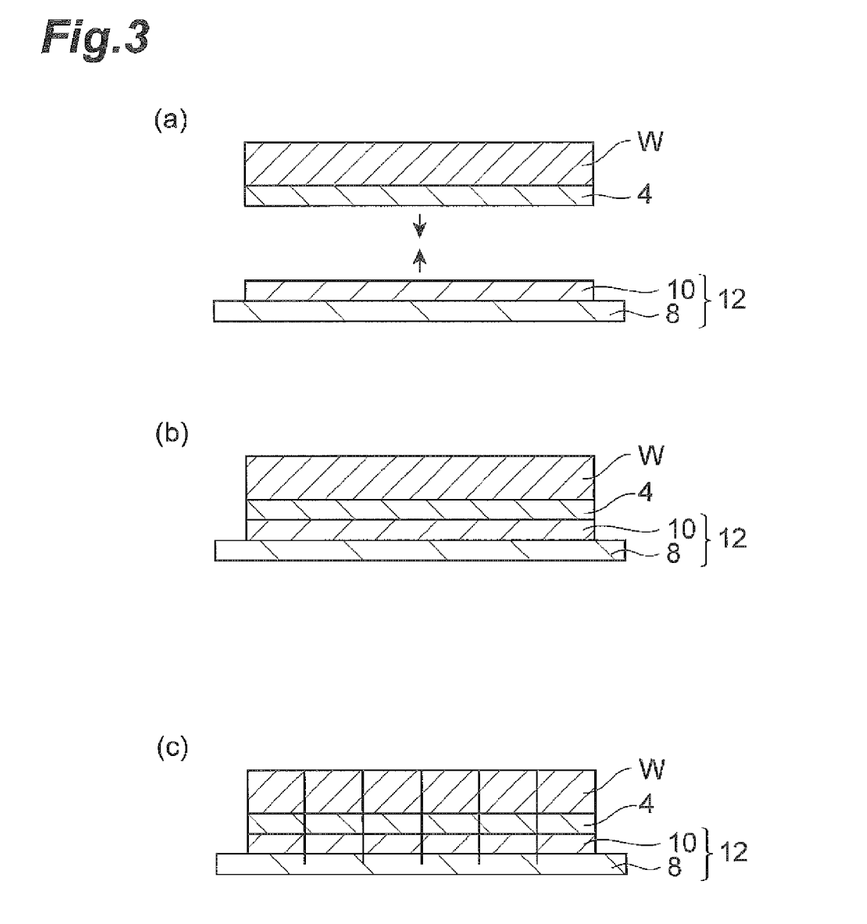
FIG. 3 is a cross-sectional diagram showing the steps following FIG. 2.
Figure 4:
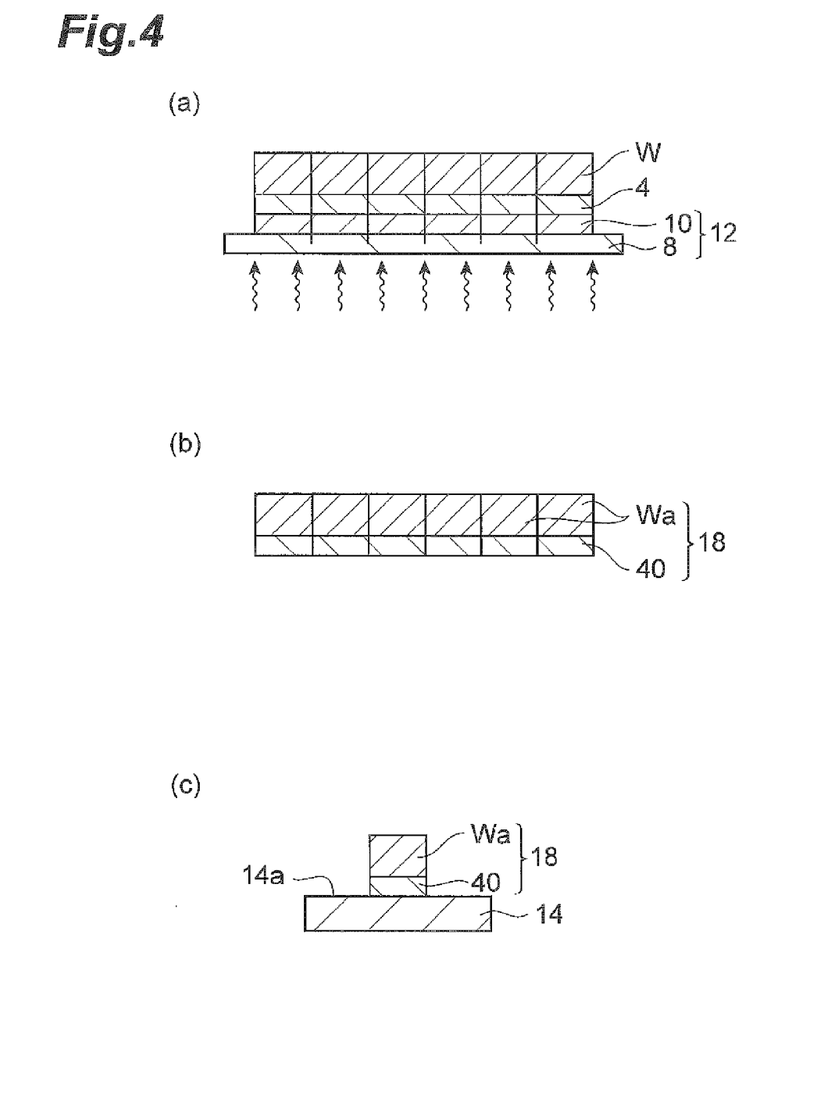
FIG. 4 is a cross-sectional diagram showing the steps following FIG. 3.

A method for manufacturing a semiconductor device using the adhesive sheet 1 will now be described. FIG. 2(a) to FIG. 2(c), FIG. 3(a) to FIG. 3(c) and FIG. 4(a) to FIG. 4(c) are cross-sectional process diagrams illustrating steps in the method for manufacturing a semiconductor device according to this embodiment.

First, as shown in FIG. 2(a) and FIG. 2(b), an adhesive sheet 1 is attached onto the main side Ws of a semiconductor wafer W via an adhesive layer 4 while pressing and heating (laminating step). The circuit side of the semiconductor wafer W is the side opposite the main side Ws. After attachment of the adhesive sheet 1, the base material 2 is peeled off, as shown in FIG. 2(c). After the base material 2 has been peeled off, a dicing sheet 12 having a construction with a base material 8 and an ultraviolet curing or cohesive layer 10 laminated in that order is attached to the adhesive layer 4 provided on the main side Ws of the semiconductor wafer W, as shown in FIG. 3(a) and FIG. 3(b), via the cohesive layer 10. After attachment of the dicing sheet 12, the semiconductor wafer W and adhesive layer 4 are diced, as shown in FIG. 3(c). During this time, the cohesive layer 10 may be simultaneously diced, and the base material 8 may be simultaneously diced up to an intermediate point.

After dicing, the cohesive layer 10 is cured by irradiating the cohesive layer 10 with ultraviolet rays (unnecessary if it is pressure-sensitive), as shown in FIG. 4(a), to lower the adhesive force between the adhesive layer 4 and the cohesive layer 10. As shown in FIG. 4(b), the cohesive layer 10 and base material 8 are peeled off from the adhesive layer 4, to obtain an adhesive layer-attached semiconductor element 18 (pickup step). The adhesive layer-attached semiconductor element 18 has a semiconductor element Wa and an adhesive layer 40. The semiconductor element Wa is obtained by segmenting the semiconductor wafer W, and the adhesive layer 40 is obtained by segmenting the adhesive layer 4. After the adhesive layer-attached semiconductor element 18 has been obtained, the adhesive layer-attached semiconductor element 18 is bonded to a supporting member 14 for semiconductor element mounting via the adhesive layer 40 by thermocompression bonding, as shown in FIG. 4(c) (die attach step).

After the semiconductor element Wa has been mounted on the supporting member 14, the adhesive layer 40 is heated at 110° C. to 125° C. for 0.5 to 1 hour (film curing step).

Next, the semiconductor element Wa and supporting member 14 are wire bonded for electrical connection at no higher than 230° C. The semiconductor element Wa, adhesive layer 40 and supporting member 14 are heated at this time at 170° C. for about 15 minutes, for example (wire bonding step).

When semiconductor elements 18 are to be layered in a successive manner, the procedure described above is repeated.

Specifically, an adhesive layer-attached semiconductor element 18 is again thermocompression bonded for bonding to a semiconductor element Wa via an adhesive layer 40. This allows multiple semiconductor elements Wa to be mounted on the supporting member 14. Next, film curing and wire bonding are repeated. A greater number of successive attachments will therefore require more after-cure times to be inserted, and long after-cure times significantly lower productivity, A resin sealing material is also formed on the surface 14a of the supporting member 14, but a resin sealing material may also be formed on the side opposite the surface 14a of the supporting member 14.

Performing this series of steps allows a semiconductor device to be produced using the adhesive sheet 1.

By specifying components (A), (B1), (B2) and (C) and their contents in the adhesive composition for the adhesive sheet 1 of this embodiment, an adhesive sheet according to one aspect of the invention can contain its components in a compatible manner and exhibit tack strength and reduced melt viscosity at 80° C. It is thus possible to impart satisfactory pickup properties and die bonding properties, and to increase the reliability of the obtained semiconductor devices. In addition, using the adhesive sheet 1 of this embodiment to produce a semiconductor device can minimize foaming during wire bonding even when the after-cure time has been shortened. Consequently, with an adhesive sheet according to the invention it is possible to increase production efficiency while providing a semiconductor device with high reliability.

In the adhesive sheet 1 of this embodiment, the adhesive layer has a melt viscosity of 300 to 3000 Pa·s at 80° C. This will allow the adhesive to adequately and satisfactorily fill the recesses of concavoconvexities formed on the surfaces of boards and the like in the die bonding step. It will therefore be possible to increase the adhesion between boards and semiconductor chips, and to further increase the reliability of semiconductor devices.

The method for manufacturing a semiconductor device comprising an adhesive layer-attached semiconductor chip using an adhesive sheet 1 according to this embodiment comprises a film curing step in which the adhesive layer-attached semiconductor chip 18 is contact bonded onto a supporting member 14 and the adhesive layer 40 is then heated at 110° C. to 125° C. for 0.5 to 1 hour, and a wire bonding step in which the adhesive layer-attached semiconductor chip and the supporting member 14 are electrically connected via bonding wire at no higher than 230° C. In this manufacturing method, the after-cure time is shorter than when using a conventional adhesive sheet, and semiconductor device production efficiency is increased.

<Semiconductor Device>

Figure 5:
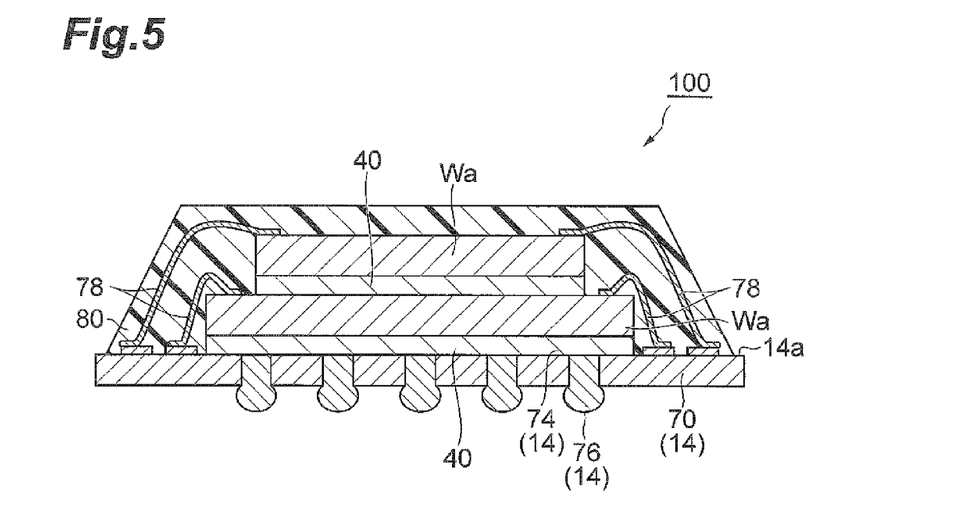
FIG. 5 is a simplified cross-sectional view of a semiconductor device according to this embodiment.

A semiconductor device 100 manufactured by the aforementioned method for manufacturing a semiconductor device will now be described. FIG. 5 is a simplified cross-sectional view of a semiconductor device according to this embodiment. The semiconductor device 100 shown in FIG. 5 comprises a supporting member 14 for semiconductor element mounting and a plurality of (for example, two) semiconductor elements Wa provided on the supporting member 14. The supporting member 14 and semiconductor element Wa are bonded via an adhesive layer 40. The semiconductor elements Wa, Wa are also bonded via adhesive layers 40. The supporting member 14 comprises a board 70 on which a circuit pattern 74 and terminals 76 are formed. The circuit pattern 74 and semiconductor element Wa are each electrically connected by wires 78 such as gold wires. Also, a resin sealing material 80, for example, is provided on the surface 14a of the supporting member 14 for sealing of the semiconductor element Wa, adhesive layer 4, circuit pattern 74 and wires 78. The sealing material 80 may also be provided on the side opposite the surface 14a of the supporting member 14.

The semiconductor device 100 is manufactured using an adhesive sheet 1, by the method for manufacturing a semiconductor device according to the embodiment described above. Consequently, the adhesive layer 4 becomes satisfactorily filled into the recesses of the concavoconvexities created by the circuit pattern 74 formed on the surface 14a of the supporting member 14. The reliability of the semiconductor device 100 can thus be increased.

An embodiment of the invention has been described in detail above, but the invention is not limited to this embodiment.

For example, an adhesive sheet 1 without a base material 2, 8 may be used for this embodiment. In other words, the adhesive sheet may be a sheet comprising a first adhesive layer 4a and a first adhesive layer 4b, or a sheet comprising a first adhesive layer 4a and a first adhesive layer 4b and cohesive layer 10, or a sheet comprising a simple adhesive layer.

Figure 6:
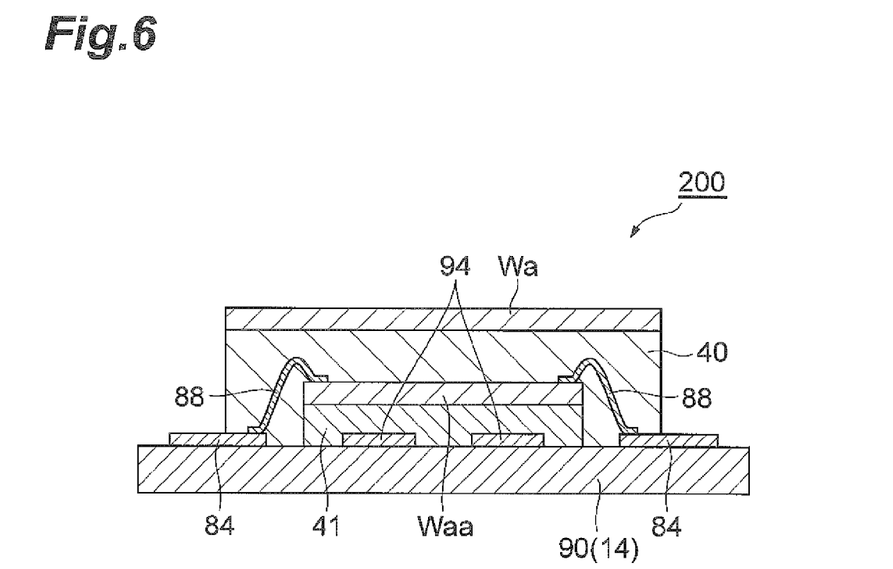
FIG. 6 is a simplified cross-sectional view of another semiconductor device according to this embodiment.

The semiconductor device to be manufactured using the adhesive sheet 1 of this embodiment is not limited to the semiconductor device 100. FIG. 6 is a simplified cross-sectional view of a semiconductor device according to a different embodiment. The semiconductor device 200 shown in FIG. 6 comprises a supporting member 14 for semiconductor element mounting, a semiconductor element Waa provided on the supporting member 14, and a semiconductor element Wa bonded with the semiconductor element Waa via an adhesive layer 40. The supporting member 14 and semiconductor element Waa are bonded via an adhesive layer 41. The adhesive 41 need only consist of a material capable of bonding the semiconductor element Waa with the supporting member 14. The supporting member 14 comprises a board 90 on which circuit patterns 84, 94 are formed. The circuit pattern 84 and semiconductor element Waa are electrically connected by wires 88 such as gold wires, and the semiconductor element Waa and wire 88 are sealed by an adhesive layer 40.

In the semiconductor device 200, the adhesive layer 40 becomes satisfactorily embedded in the recesses of the concavoconvexities created by the wires 88 and circuit pattern 84. The adhesive layer 40 can also prevent contact between the semiconductor element Wa and the wires 88. The reliability of the semiconductor device can thereby be increased. Also, the adhesive layer 40 in the semiconductor device 200 can comprehensively seal the semiconductor element Waa and the wires 88.

The semiconductor device manufactured using the adhesive sheet 1 of this embodiment may also be the semiconductor device 400 described below. The semiconductor device 400 illustrated in FIG. 7(b) has individuated chips (second-level semiconductor element Wb+adhesive layer 40) contact bonded onto an evaluation board 300, and is manufactured by the following procedure. First, the adhesive layer 40 (thickness: 60 μm) of the adhesive sheet 1 is attached onto a 50 μm-thick semiconductor wafer (size: 8 inches) at 70° C. These are then diced into 7.5 mm squares to obtain a semiconductor element (chip) Wb on which an adhesive layer 40 has been bonded (see FIG. 7(a)).

Figure 7:
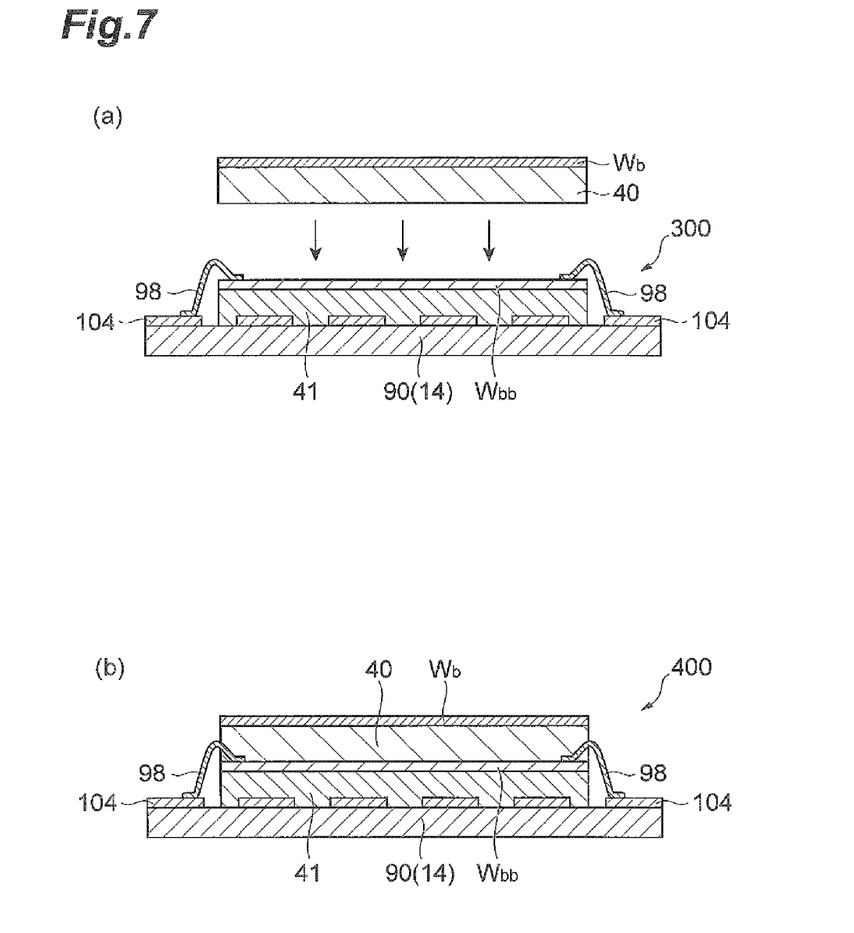
FIG. 7 is a simplified cross-sectional view of another semiconductor device according to this embodiment.

Next, as shown in FIG. 7(a), the adhesive layer 40 of the individuated semiconductor element Wb is contact bonded with the evaluation board 300 at 120° C., 0.10 MPa for 1 second to obtain a semiconductor device 400. In the evaluation board 300 shown in FIG. 7, the first-level semiconductor element Wbb is bonded to the supporting member 14 by an adhesive 41. The supporting member 14 comprises a board 90 on which a circuit pattern 104 is formed. The adhesive 41 need only consist of a material capable of bonding the semiconductor element Wbb with the supporting member 14. For example, an FH-900-20 film adhesive by Hitachi Chemical Co., Ltd. may be used. Wires 98 are connected to the semiconductor element Wbb. The wires 98 are connected at the two opposing sides, and for example, they are situated with 32 on each side at spacings of 225 μm.

(E) Curing Accelerator

1-Cyanoethyl-2-phenylimidazole (CUREZOL): "2PZ-CN", trade name of Shikoku Chemicals Corp.

(F) Coupling Agent

γ-Mercaptopropyltrimethoxysilane: "NUC A-189", trade name of Nippon Unicar Co., Ltd.

γ-Ureidopropyltriethoxysilane: "NUC A-1160", trade name of Nippon Unicar Co., Ltd.

TABLE 1

| Item | | Example 1 | Example 2 | Comp. Example 1 | Comp. Example 2 | Comp. Example 3 |
| --- | --- | --- | --- | --- | --- | --- |
| (A) High-molecular-weight component | HTR-860P-3 | 16 | 19 | 16 | 16 | 16 |
| (B1) Thermosetting component | YDCN-700-10 | 14 | 14 | 24 | 24 | 14 |
| (B2) Thermosetting component | EXA-830CRP | 15 | 15 | 5 | 5 | 15 |
| (C) Curing agent | LF-4871 | — | — | 23 | — | 23 |
| | MILEX XLC-LL | 23 | 22 | — | 23 | — |
| (D) Filler | SC2050-HLG | 32 | 31 | 32 | 32 | 32 |
| (E) Curing accelerator | CUREZOL 2PZ-CN | 0.10 | 0.1 | 0.10 | 0.10 | 0.10 |
| (F) Coupling agent | NUC A-189 | 0.2 | 0.2 | 0.2 | 0.2 | 0.2 |
| | NUC A-1160 | 0.1 | 0.1 | 0.1 | 0.1 | 0.1 |

EXAMPLES

The present invention will now be explained in greater detail by examples, with the understanding that the invention is not limited by the examples.

<Fabrication of Adhesive Sheet>

For Examples 1 and 2 and Comparative Examples 1 to 3, the components listed in Table 1 were used to prepare varnishes comprising adhesive compositions, by the following procedure. First, after combining component (B1), component (B2) and (D) a filler, cyclohexanone was added, the mixture was stirred, and then component (A), (E) a curing accelerator and (F) a coupling agent were added and the mixture was stirred until the components became uniform, to obtain an adhesive composition varnish.

(A) High-Molecular-Weight Component (A)

Acrylic rubber: "HTR-860P-3", trade name of Nagase ChemteX Corp., weight-average molecular weight: 800,000, glass transition point: −13° C.

(B) Thermosetting Component (B1)

Cresol-novolac-type epoxy resin: "YDCN-700-10", trade name of Tohto Kasei Co., Ltd., epoxy equivalents: 210

(B) Thermosetting Component (B2)

Bisphenol F-type epoxy resin: "EXA-830CRP", trade name of DIC Corp., epoxy equivalents: 159

(C) Phenol Resin with Softening Point of no Higher than 100° C. (Curing Agent)

Phenol resin: "MILEX XLC-LL", trade name of Mitsui Chemicals, Inc., softening point: 75° C., hydroxyl equivalents: 175

Phenol resin: "PHENOLITE LF-4871", trade name of Dainippon Ink and Chemicals, Inc., softening point: 130° C., hydroxyl equivalents: 118

(D) Filler

Silica filler: "SC2050-HLG", trade name of Admatechs, mean particle diameter: 0.500 μm Next, the varnish was coated onto a release-treated polyethylene terephthalate film with a thickness of 38 μm, as a base film, and heat dried on the base film at 140° C. for 5 minutes to fabricate an adhesive sheet (thickness: 40 μm).

<Evaluation of Adhesive Sheet>

The properties of the adhesive sheets fabricated in Examples 1 and 2 and Comparative Examples 1 to 3 were evaluated in the following manner.

(1) Measurement of Melt Viscosity

The melt viscosity of the adhesive layer of each adhesive sheet in Examples 1 and 2 and Comparative Examples 1 to 3 was measured using a rotating viscoelasticity meter (ARES-RDA, product of TA Instruments, Japan). The specific procedure was as follows. First, the base film 2 was released from the adhesive sheet 1, and then several adhesive layers 4 were attached by lamination at 70° C. to a film thickness of 100 μm or greater, and punched into a circle with a diameter of 8 mm. The circular film was sandwiched by two 8 mm jigs to form a sample, and measurement was performed (measuring conditions: frequency=1 Hz, initial measurement temperature=35° C., final measurement temperature=150° C., temperature-elevating rate=5° C./min, with the value at 80° C. being read off as the measurement value). The results are shown in Table 2.

(2) Wire Embeddability

FH-900-25 (product of Hitachi Chemical Co., Ltd.) was attached to the back side of a 150 μm-thick semiconductor wafer that had been surface-coated with Al, and a dicer (DFD-6361 by Disco) was used for dicing to 7.5 mm×7.5 mm Thermocompression bonding was carried out at 150° C./0.04 MPa/1 sec using a flexible die bonder (DB730SP by Renesas East Japan Semiconductor, Inc.). Stat bumps were formed with a wire bonder (UTC-230BI, by Shinkawa, Ltd.), and an elastomer applicator ("ES-10", trade name of Renesas East Japan Semiconductor, Inc.) was used for leveling of the bumps at r.t./3.2 kgf (50 g/bump)/3 sec. Bonding was performed with the wire bonder to obtain a board for evaluation of wire embeddability. A 100 μm-thick semiconductor wafer was laminated with the adhesive sheet 1 at 70° C., and a dicer was used for dicing to 7.5 mm×7.5 mm. Next, thermocompression bonding was performed under conditions of 120° C./0.1 MPa/1 sec with a flexible die bonder, to obtain an evaluation sample. A vacuum vapor deposition machine (VE2030 by Shinkuu Device Co., Ltd.) was used for carbon vapor deposition of the evaluation sample. An environment-controlled scanning electron microscope ("LC30", trade name of Philips) was used for observation of the wire embedded sections at 15° oblique angle, for evaluation of the embeddability. Satisfactory embeddability was evaluated as "G", and poor embeddability was evaluated as "P". The measurement results are shown in Table 2.

(3) Measurement of Bonding Strength

The die shear strength (bonding strength) of the adhesive layer was measured by the following method. First, the adhesive layer of the adhesive sheet was attached onto a 400 μm-thick semiconductor wafer at 70° C. These were then diced into 5 mm squares to obtain adhesive layer-attached semiconductor chips. The adhesive layer sides of the individuated adhesive layer-attached semiconductor chips were thermocompression bonded onto a lead frame ("42 Alloy LF810TR", trade name of DaiNippon Printing Co., Ltd.) under conditions of 120° C./0.1 MPa/5 s. Next, step curing was carried out in an oven at 110° C./1 hour+170° C./3 hours, for complete curing of the die bonding film. A multipurpose bond tester (Series 4000 by Dage Inc.) was used to measure the die shear strength under conditions of 6.7 MPa/sec and a temperature of 250° C., and this was recorded as the bonding strength. The measurement results are shown in Table 2.

(4) Insulating Reliability Test (HAST: Highly Accelerated Storage Test)

On an electrolytic corrosion testing board (Espanex with the copper foil etched to form a comb-shaped pattern (non-gold-plated, line width: 30 μm, space width: 70 μm), there was attached a cut film (5 mm×12 mm) with a contact bonder (100° C., pressure: 2 kgf, attachment time: 10 sec). This was cured at 170° C. for 5 hours to prepare a sample. After curing, the sample was set in an accelerated life tester (trade name: PL-422R8 by Hirayama, conditions: 130° C./85%/100 hours) to measure the insulation resistance. The evaluation method judged maintenance of 106Ω or lower within 20 hours as "P", of 106Ω or lower after 50 hours and no longer than 100 hours as "F", and of 106Ω or greater for 100 hours or longer as "G". The measurement results are shown in Table 2.

(5) Tack Strength Measurement Test

The tack strengths of the adhesive layer sheets of Examples 1 and 2 and Comparative Examples 1 to 3 were measured by the probe method. Specifically, the adhesive layer of the adhesive sheet was first fixed onto a parallel glass plate with double-sided tape. The base film was then released from the adhesive sheet, a probe was placed on a 30° C. hot plate and pressed against the surface of the adhesive layer under the following conditions, and the strength upon pulling the probe from the adhesive layer was recorded as the tack strength. The measurement results are shown in Table 2.

Test speed: 5 mm/min
Press time: 1.0 seconds
Initial load (preload): 200 gf (6) Foaming Test First, an adhesive sheet was laminated on a 100 μm-thick semiconductor wafer at 70° C. and individuated to 10 mm×10 mm. The individuated adhesive sheet-attached chips were contact bonded to a 625 μm-thick semiconductor wafer under conditions of 120° C./0.1 MPa/1 sec, and then thermoset at 110° C. for 1 hour and subjected to wire bonding-level heating on a hot plate at 200° C. for 10 minutes. Next, an ultrasonic probe (SAT) ("HYE-FOCUS", trade name of Hitachi Construction Machinery Co., Ltd.) was used to evaluate the presence or absence of foaming. Samples without foaming were evaluated as "+", and those with foaming were evaluated as "−". The results from the measurement are shown in Table 2.

TABLE 2

| Item | Example 1 | Example 2 | Comp. Example 1 | Comp. Example 2 | Comp. Example 3 |
|---|---|---|---|---|---|
| Melt viscosity at 80° C. (Pa·s) | 1300 | 2800 | 3500 | 1000 | 4500 |
| Wire embeddability | G | G | F | G | P |
| Bonding strength (MPa) | 3.2 | 3.1 | 4.5 | 2.5 | 4.0 |
| Tack strength (gf) | 150 | 120 | 400 | 800 | 100 |
| Insulating reliability test | G | G | P | G | F |
| Foaming test | + | + | + | − | + |

INDUSTRIAL APPLICABILITY

According to the invention it is possible to provide an adhesive sheet that has increased production efficiency as well as satisfactory embeddability and pickup properties, and that allows semiconductor devices with high reliability to be obtained.

REFERENCE SIGNS LIST

1: Adhesive sheet, 2, 8: base materials, 4, 40: adhesive layers, W: semiconductor wafer, Ws: main side of semiconductor wafer, Wa: semiconductor element, 10: cohesive layer, 12: dicing sheet, 14: supporting member, 14a: supporting member surface, 18: adhesive layer-attached semiconductor element, 70: board, 74, 84, 94, 104: circuit patterns, 76: terminal, 78, 88, 98: wires, 80: sealing material, 100, 200, 400: semiconductor devices.

The invention claimed is:

1. An adhesive sheet comprising a resin composition containing: (A) a high-molecular-weight component; (B1) a thermosetting component having a softening point of below 50° C.; (B2) a thermosetting component having a softening point of between 50° C. and 100° C.; and (C) a phenol resin having a softening point of no higher than 100° C., the composition containing 11 to 22 mass % of the (A) high-molecular-weight component, 10 to 20 mass % of the (B1) thermosetting component having a softening point of below 50° C., 10 to 20 mass % of the (B2) thermosetting component having a softening point of between 50° C. and 100° C. and 15 to 30 mass % of the phenol resin having a softening point of no higher than 100° C., based on 100 mass % of the resin composition.

2. An adhesive sheet according to claim 1, wherein an adhesive layer of the resin composition has a melt viscosity at 80° C. is 300 to 3000 Pa·s.

3. A method for manufacturing a semiconductor device comprising an adhesive layer-attached semiconductor chip using an adhesive sheet according to claim 1, the method for manufacturing a semiconductor device comprising:
a film curing step in which the adhesive layer-attached semiconductor chip is contact bonded onto a circuit board and the adhesive layer is then heated at 110° C. to 125° C. for 0.5 to 1 hour; and a wire bonding step in which the adhesive layer-attached semiconductor chip and the circuit board are electrically connected via bonding wire at no higher than 230° C.

4. An adhesive sheet according to claim 1, wherein a layer of said resin composition is provided on a base material.

5. An adhesive sheet according to claim 1, wherein said thermosetting component (B1) is a cresol-novolac epoxy resin having a softening point of below 50° C., and said thermosetting component (B2) having a softening point of between 50° C. and 100° C. is a bisphenol F epoxy resin.

6. An adhesive sheet according to claim 1, wherein a tack strength of a layer of the adhesive composition is 0 to 1000 gf, at 30° C.

7. An adhesive sheet according to claim 1, wherein a glass transition temperature (Tg) of the high-molecular-weight component (A) is −50° C. to 50° C.

8. An adhesive sheet according to claim 1, wherein said thermosetting component (B1) is a novolac epoxy resin having a softening point of below 50° C., and said thermosetting component (B2) is a bisphenol F epoxy resin having a softening point of between 50° C. and 100° C.

9. An adhesive sheet according to claim 1, wherein each of the components (B1) and (B2) is an epoxy resin.

* * * * *